(12) United States Patent
Wang

(10) Patent No.: US 10,658,992 B1
(45) Date of Patent: May 19, 2020

(54) OPERATIONAL TRANSCONDUCTANCE AMPLIFIER

(71) Applicant: Rafael Microelectronics, Inc., Hsinchu County (TW)

(72) Inventor: Tzu-Yun Wang, Hsinchu County (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 21 days.

(21) Appl. No.: 16/234,595

(22) Filed: Dec. 28, 2018

(51) Int. Cl.
*H03F 3/45* (2006.01)
*H03H 11/04* (2006.01)

(52) U.S. Cl.
CPC ..... *H03F 3/45264* (2013.01); *H03F 3/45165* (2013.01); *H03H 11/0422* (2013.01); *H03F 2200/465* (2013.01); *H03F 2203/45288* (2013.01); *H03F 2203/45352* (2013.01)

(58) Field of Classification Search
CPC .... H03F 3/45; H03F 3/45165; H03F 3/45363; H03F 3/45461

USPC ......................................................... 330/253
See application file for complete search history.

(56) References Cited

U.S. PATENT DOCUMENTS

2019/0006998 A1* 1/2019 Steiner ................ H03F 3/45645

* cited by examiner

*Primary Examiner* — Steven J Mottola
(74) *Attorney, Agent, or Firm* — Litron Patent & Trademark Office; Min-Lee Teng

(57) ABSTRACT

A circuit for implementing an operational transconductance amplifier (OTA) based on telescopic topology, wherein cascode transistors of the operational transconductance amplifier (OTA) are self-biased without using additional biasing circuitry, which not only reduces power consumption but also achieves high gain without extra current, and each cascode stage of the OTA has a pair of transistors so that the swing of the output differential signals of the OTA can be completely symmetrical so as to benefit second-order harmonic rejection, CMRR and PSRR.

11 Claims, 6 Drawing Sheets

OPERATIONAL TRANSCONDUCTANCE AMPLIFIER

BACKGROUND OF THE INVENTION

1. Field of the Invention

The invention relates to a circuit for implementing an amplifier, and in particular, but not exclusively, to a circuit for implementing an operational transconductance amplifier.

2. Description of the Prior Art

FIG. 1 shows a conventional circuit used in U.S. Pat. No. 8,200,325B2 for implementing an operational transconductance amplifier (OTA) based on a folded cascode structure that consumes extra current in the output branches to achieve high gain, and the cascode transistors have to be biased by additional biasing circuitry, which will increase the power consumption and the circuit area of the conventional operational transconductance amplifier (OTA). In addition, the gain ($G_m$) of the conventional operational transconductance amplifier (OTA) is half of the telescopic topology. Furthermore, single-ended signals used in U.S. Pat. No. 8,200,325B2 will degrade the performance in second-order harmonic rejection, Common-Mode Rejection Ratio (CMRR), and Power Supply Rejection Ratio (PSRR).

FIG. 2 shows another conventional circuit in U.S. Pat. No. 6,747,514B1 for implementing an operational transconductance amplifier (OTA). As shown in FIG. 2, the cascode transistors of the conventional operational transconductance amplifier (OTA) still have to be biased by additional biasing circuitry. The gain ($G_m$) of the conventional operational transconductance amplifier (OTA) is half of the telescopic topology. In the case of a telescopic cascode design, the biasing branches occupy double area and double current for P and N type transistors.

Accordingly, there is a need to provide a better solution to resolve the aforementioned issues.

SUMMARY OF THE INVENTION

One objective of present invention is to provide a circuit for implementing an operational transconductance amplifier (OTA) based on telescopic cascode topology, wherein cascode transistors of the operational transconductance amplifier (OTA) are self-biased without using additional biasing circuitry, which not only reduces power consumption but also achieves high gain without extra current.

The present invention discloses a circuit for implementing an operational transconductance amplifier (OTA), said circuit comprising: a first pair of transistors, comprising a first transistor having a first terminal, a second terminal and a third terminal and a second transistor having a fourth terminal, a fifth terminal and a sixth terminal, wherein the second terminal and the fourth terminal are connected at a first node, and the third terminal and the sixth terminal are connected at a second node; a second pair of transistors, comprising a third transistor having a seventh terminal, an eighth terminal and a ninth terminal and a fourth transistor having a tenth terminal, a eleventh terminal and a twelfth terminal, wherein the eighth terminal and the eleventh terminal are connected at a third node, and the ninth terminal and the twelfth terminal are connected at a fourth node; a third pair of transistors, comprising a fifth transistor having a thirteenth terminal, a fourteenth terminal and a fifteenth terminal and a sixth transistor having a sixteenth terminal, a seventeenth terminal and an eighteenth terminal, wherein the fourteenth terminal and the seventeenth terminal are connected to the second node, and the fifteenth terminal and the eighteenth terminal are connected at a fifth node; a fourth pair of transistors, comprising a seventh transistor having a nineteenth terminal, a twentieth terminal and a twenty-first terminal and an eighth transistor having a twenty-second terminal, a twenty-third terminal and a twenty-fourth terminal, wherein the twentieth terminal and the twenty-third terminal are connected to the fourth node, and the twenty-first terminal and the twenty-fourth terminal are connected at a sixth node; a fifth pair of transistors, comprising a ninth transistor having a twenty-fifth terminal, a twenty-sixth terminal and a twenty-seventh terminal and a tenth transistor having a twenty-eighth terminal, a twenty-ninth terminal and a thirtieth terminal, wherein the twenty-sixth terminal is connected to the fifth node that is connected to the fifth terminal of the second transistor and the seventh terminal of the third transistor, and the thirtieth terminal is connected to the first node that is connected to the thirteenth terminal of the fifth transistor and the twenty-second terminal of the eighth transistor, wherein the twenty-fifth terminal and the twenty-eighth terminal are connected at a seventh node; and a sixth pair of transistors, comprising an eleventh transistor having a thirty-first terminal, a thirty-second terminal and a thirty-third terminal and a twelfth transistor having a thirty-fourth terminal, a thirty-fifth terminal and a thirty-sixth terminal, wherein the thirty-third terminal is connected to the sixth node that is connected to the first terminal and the tenth terminal, and the thirty-sixth terminal is connected to the third node that is connected to the sixteenth terminal and the nineteenth terminal, wherein, the thirty-first terminal and the thirty-fourth terminal are connected at an eighth node; wherein the fourth node and the second node are capable of outputting a first pair of differential signals according to a second pair of differential signals inputted to seventh node and the eighth node.

In one embodiment, the twenty-ninth terminal and the thirty-fifth terminal are connected to a current source, and the twenty-seventh terminal and the thirty-second terminal are connected to another current source.

In one embodiment, each of the twenty-ninth terminal, the thirty-fifth terminal, the twenty-seventh terminal and the thirty-second terminal is respectively connected to a separate current source.

In one embodiment, each of the twenty-ninth terminal and the thirty-fifth terminal is respectively connected to a separate current source, and the twenty-seventh terminal and the thirty-second terminal are connected to another current source.

In one embodiment, each of the first, second, third, fourth, tenth and twelfth transistors is a P-type CMOS transistor, and each of the fifth, sixth, seventh, eighth, ninth, eleventh transistors is an N-type CMOS transistor.

In one embodiment, each of the first, second, third, fourth, tenth and twelfth transistors is an N-type CMOS transistor, and each of the fifth, sixth, seventh, eighth, ninth, eleventh transistors is a P-type CMOS transistor.

In one embodiment, each casocde transistor in the first pair of transistors, the second pair of transistors, the third pair of transistors and the fourth pair of transistors is operated in a subthreshold region to ensure output swing range. Said casocde transistors are operated in the subthreshold region to guarantee small $V_{DS}$ ($V_{GS}$ is always equal to $2V_{DSsat}$).

In one embodiment, each of the first, second, third, fourth, tenth and twelfth transistors is a PNP Bipolar transistor, and each of the fifth, sixth, seventh, eighth, ninth, eleventh transistors is an NPN Bipolar transistor.

In one embodiment, each of the first, second, third, fourth, tenth and twelfth transistors is an NPN Bipolar transistor, and each of the fifth, sixth, seventh, eighth, ninth, eleventh transistors is a PNP Bipolar transistor.

In one embodiment, the operational transconductance amplifier (OTA) is adopted in a low-power sensing amplifier with high gain.

In one embodiment, the operational transconductance amplifier (OTA) is utilized to implement fully differential $G_m$-C filters for low-power operation.

The detailed technology and above preferred embodiments implemented for the present invention are described in the following paragraphs accompanying the appended drawings for people skilled in the art to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF EMBODIMENT

The detailed explanation of the present invention is described as follows. The described preferred embodiments are presented for purposes of illustrations and description, and they are not intended to limit the scope of the present invention.

Figure 1:
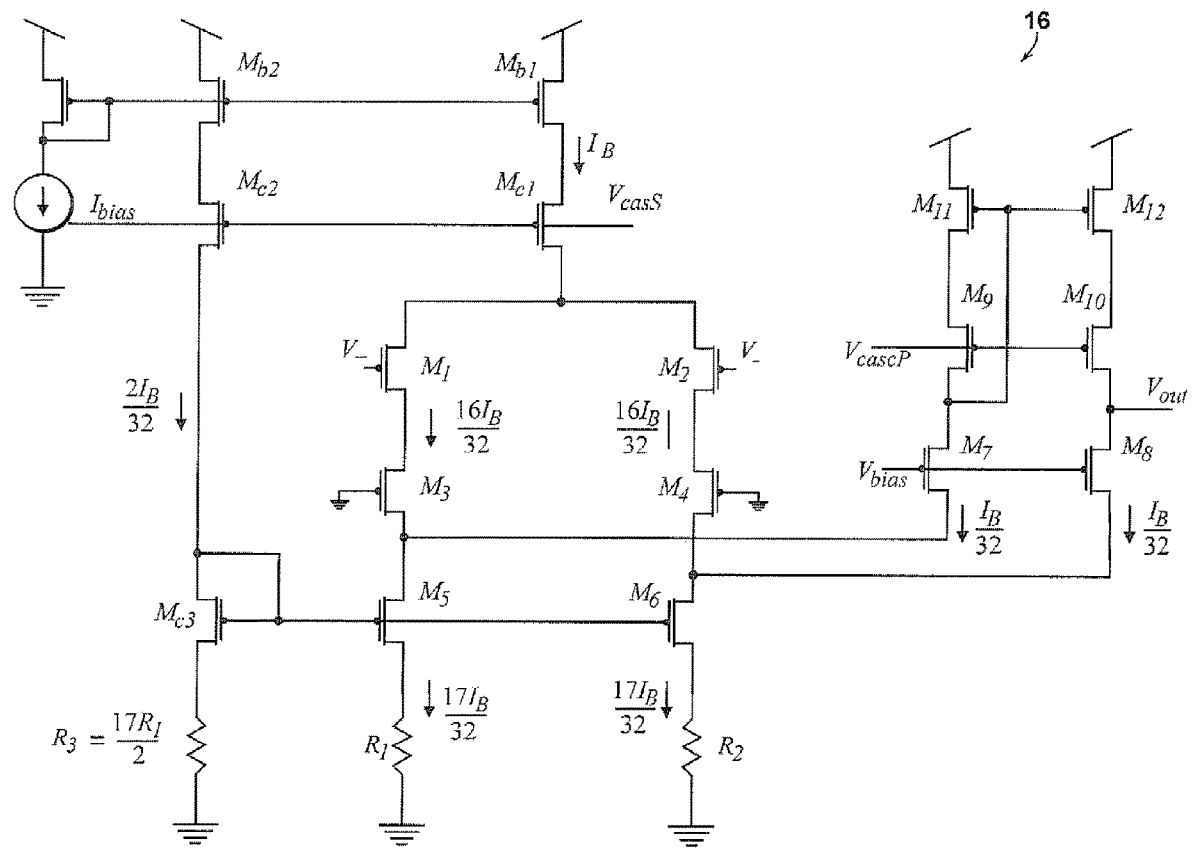
FIG. 1 illustrates a conventional circuit for implementing an operational transconductance amplifier (OTA) based on a folded cascode structure.
Figure 2:
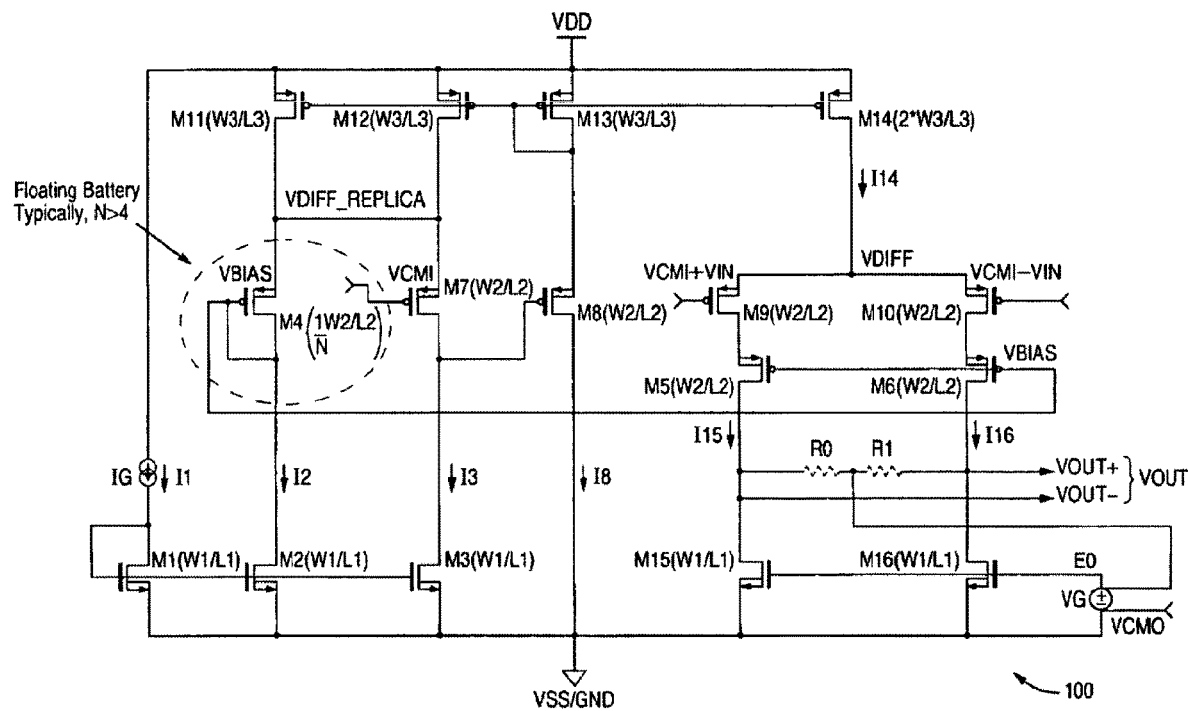
FIG. 2 illustrates another conventional circuit for implementing an operational transconductance amplifier (OTA)
Figure 3A:
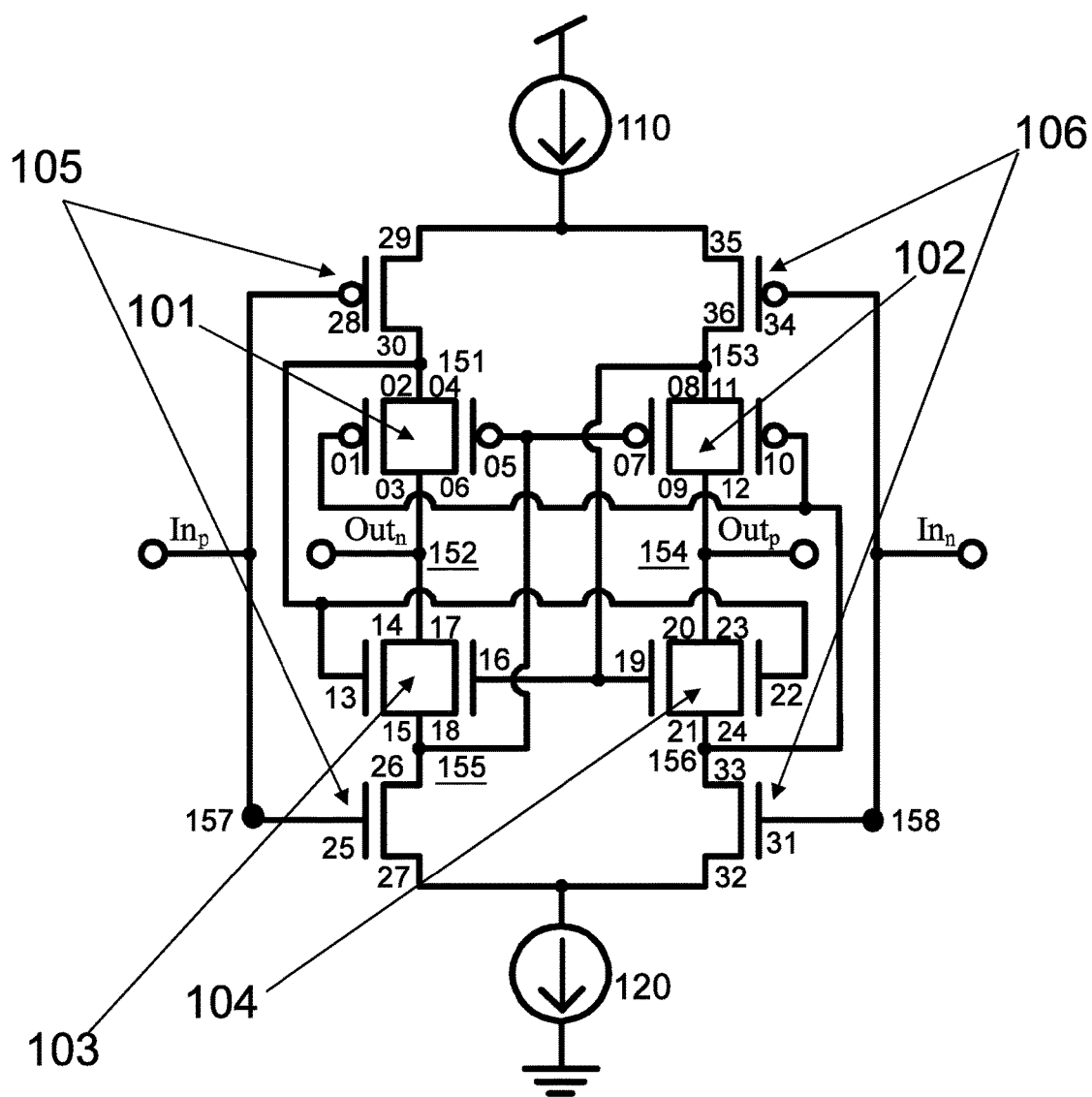
FIG. 3A illustrates a circuit for implementing an operational transconductance amplifier according to one embodiment of the present invention.

FIG. 3A illustrates a circuit for implementing an operational transconductance amplifier 100 (will be referred to as OTA hereafter) in accordance with one embodiment of the present invention. As shown in FIG. 3A, the circuit for implementing an OTA 100 comprises: a first pair of transistors 101, comprising a first transistor having a first terminal 01, a second terminal 02 and a third terminal 03 and a second transistor having a fourth terminal 04, a fifth terminal 05 and a sixth terminal 06, wherein the second terminal 02 and the fourth terminal 04 are connected at a first node 151, and the third terminal 03 and the sixth terminal 06 are connected at a second node 152; a second pair of transistors 102, comprising a third transistor having a seventh terminal 07, an eighth terminal 08 and a ninth terminal 09 and a fourth transistor having a tenth terminal 10, an eleventh terminal 11 and a twelfth terminal 12, wherein the eighth terminal 08 and the eleventh terminal 11 are connected at a third node 153, and the ninth terminal 09 and the twelfth terminal 12 are connected at a fourth node 154; a third pair of transistors 103, comprising a fifth transistor having a thirteenth terminal 13, a fourteenth terminal 14 and a fifteenth terminal 15 and a sixth transistor having a sixteenth terminal 16, a seventeenth terminal 17 and an eighteenth terminal 18, wherein the fourteenth terminal 14 and the seventeenth terminal 17 are connected to the second node 152, and the fifteenth terminal 15 and the eighteenth terminal 18 are connected at a fifth node 155; a fourth pair of transistors, comprising a seventh transistor having a nineteenth terminal 19, a twentieth terminal 20 and a twenty-first terminal 21 and an eighth transistor having a twenty-second terminal 22, a twenty-third terminal 23 and a twenty-fourth terminal 24, wherein the twentieth terminal 20 and the twenty-third terminal 23 are connected to the fourth node 154, and the twenty-first terminal and the twenty-fourth terminal 24 are connected at a sixth node 156; a fifth pair of transistors 105, comprising a ninth transistor having a twenty-fifth terminal 25, a twenty-sixth terminal 26 and a twenty-seventh terminal 27 and a tenth transistor having a twenty-eighth terminal 28, a twenty-ninth terminal and a thirtieth terminal, wherein the twenty-sixth terminal 26 is connected to the fifth node 105 that is connected to the fifth terminal 05 of the second transistor and the seventh terminal 07 of the third transistor, and the thirtieth terminal 30 is connected to the first node 151 that is connected to the thirteenth terminal 13 of the fifth transistor and the twenty-second terminal 22 of the eighth transistor, wherein the twenty-fifth terminal 25, and the twenty-eighth terminal 28 are connected at a seventh node 157; and a sixth pair of transistors 106, comprising an eleventh transistor having a thirty-first terminal 31, a thirty-second terminal 32 and a thirty-third terminal 33 and a twelfth transistor having a thirty-fourth terminal 34, a thirty-fifth terminal 35 and a thirty-sixth terminal 36, wherein the thirty-third terminal 33 is connected to the sixth node 156 that is connected to the first terminal 01 and the tenth terminal 10, and the thirty-sixth terminal 36 is connected to the third node 153 that is connected to the sixteenth terminal 16 and the nineteenth terminal 19, wherein the thirty-first terminal 31 and the thirty-fourth terminal 34 are connected at an eighth node 158; wherein the fourth node 154 and the second node 152 are capable of outputting a first pair of differential signals ($Out_p$, $Out_n$) according to a second pair of differential signals ($In_p$, $In_n$) inputted to the seventh node 157 and the eighth node 158.

Figure 3B:
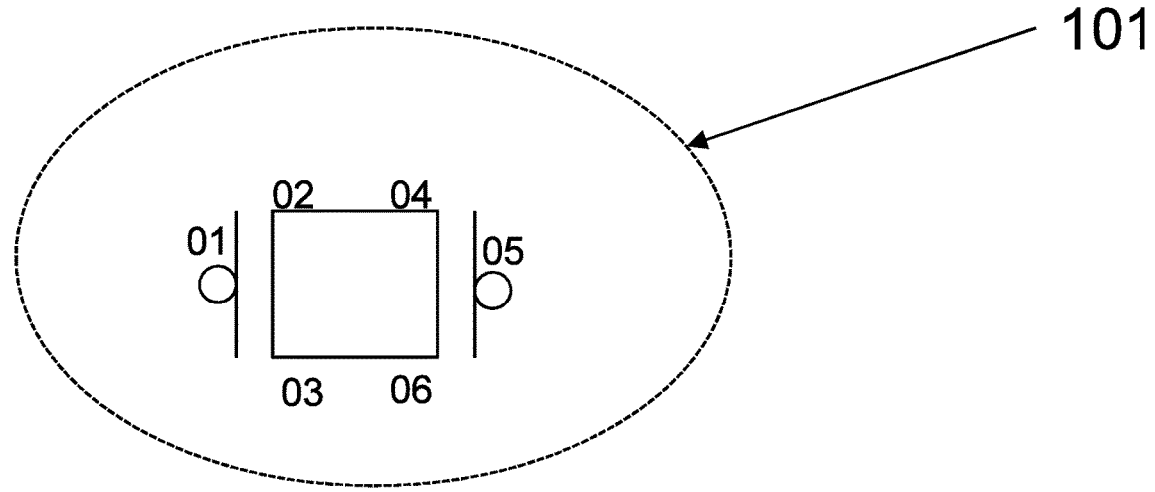
FIG. 3B illustrates the first pair of transistors in FIG. 3A.
Figure 3C:
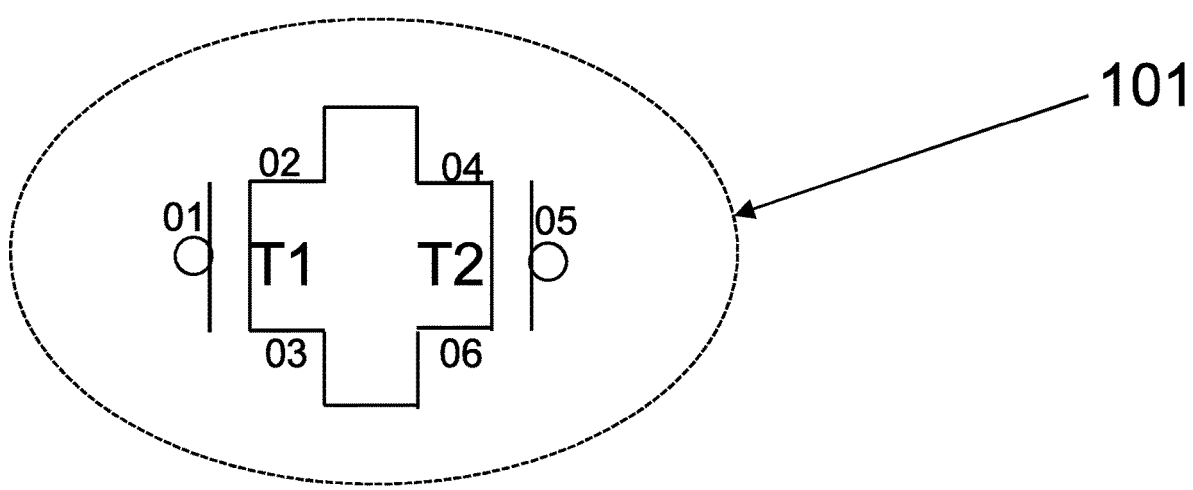
FIG. 3C illustrates the equivalent circuit of the first pair of transistors in FIG. 3B.

FIG. 3B illustrates the first pair of transistors 101 in FIG. 3A and FIG. 3C illustrates the equivalent circuit of the first pair of transistors 101 in FIG. 3B. Please refer to FIG. 3A and FIG. 3B. As shown in FIG. 3C, the first pair of transistors 101 includes a first transistor T1 having three terminals 01, 02, 03 and a second transistor T2 having three terminals 04, 05, 06, wherein the terminals 02 and 04 are electrically connected and the terminals 03 and 06 are electrically connected. For example, both T1 and T2 can be P-type CMOS transistors and the three terminals 01, 02, 03 of the first transistor T1 correspond to gate terminal, drain terminal and source terminal of the first transistor T1; and said three terminals 04, 05, 06 of the second transistor T2 correspond to gate terminal, drain terminal and source terminal of the second transistor T2. Please note that the present invention is not limited to the type of the transistors for implementing the OTA. Each pair of transistors 102, 103, 104 in FIG. 3A can be described according to the equivalent circuit shown in FIG. 3B.

Please note that each transistor of the first pair of transistors 101, the second pair of transistors 102, the third pair of transistors 103 and the fourth pair of transistors 104 is biased by a corresponding output terminal of the fifth pair of transistors 105 and the sixth pair of transistors 106, as shown in FIG. 3A, without using additional biasing circuitry. Furthermore, each cascode stage has a pair of transistors as shown in FIG. 3B so that the swing of the output differential signals (Out$_p$, Out$_n$) can be completely symmetrical so as to benefit second-order harmonic rejection, CMRR and PSRR.

In one embodiment, each of the first, second, third, fourth, tenth and twelfth transistors is a P-type CMOS transistor, and each of the fifth, sixth, seventh, eighth, ninth, eleventh transistors is an N-type CMOS transistor.

In one embodiment, each of the first, second, third, fourth, tenth and twelfth transistors is an N-type CMOS transistor, and each of the fifth, sixth, seventh, eighth, ninth, eleventh transistors is a P-type CMOS transistor.

In one embodiment, each transistor in the first pair of transistors, the second pair of transistors, the third pair of transistors and the fourth pair of transistors is a CMOS transistor operated in the subthreshold region to guarantee small $V_{DS}$ ($V_{GS}$ is always equal to $2V_{DSsat}$).

In one embodiment, the twenty-ninth terminal 29 and the thirty-fifth 35 terminal are connected to a current source 110, and the twenty-seventh terminal 27 and the thirty-second terminal 32 are connected to another current source 120.

In one embodiment, each of the twenty-ninth terminal 29, the thirty-fifth terminal 35, the twenty-seventh terminal 27 and the thirty-second terminal 32 is respectively connected to a separate current source, for example, by using a current mirror circuit.

In one embodiment, each of the twenty-ninth terminal 29 and the thirty-fifth terminal 35 is respectively connected to a separate current source, for example, by using a current mirror circuit; and the twenty-seventh terminal 27 and the thirty-second terminal 32 are connected to another current source.

In one embodiment, each of the first, second, third, fourth, tenth and twelfth transistors is a PNP Bipolar transistor, and each of the fifth, sixth, seventh, eighth, ninth, eleventh transistors is an NPN Bipolar transistor.

In one embodiment, each of the first, second, third, fourth, tenth and twelfth transistors is an NPN Bipolar transistor, and each of the fifth, sixth, seventh, eighth, ninth, eleventh transistors is a PNP Bipolar transistor.

Figure 4:
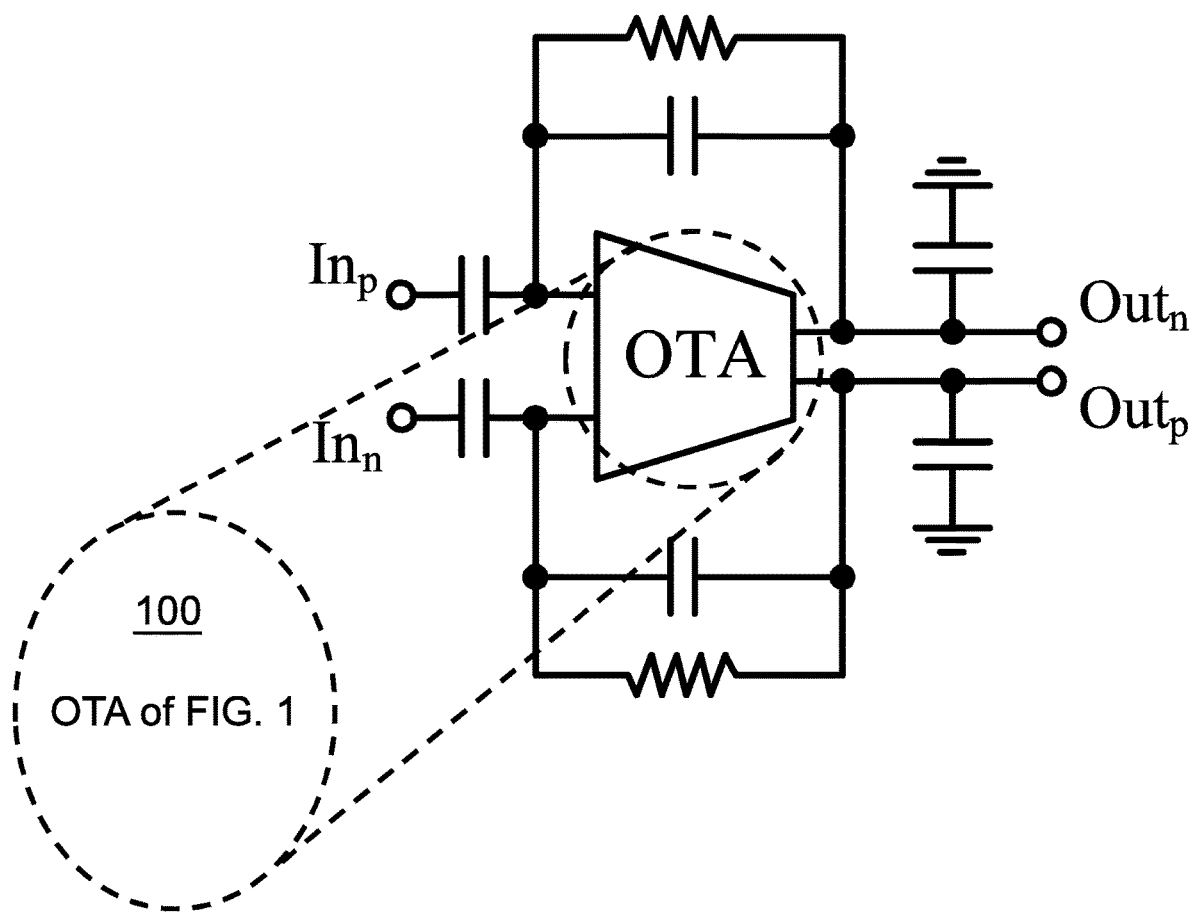
FIG. 4 illustrates an application of the operational transconductance amplifier of FIG. 3A according to one embodiment of the present invention.

In one embodiment, as shown in FIG. 4, the OTA of the present invention can be adopted in a low-power sensing amplifier with high gain.

Figure 5:
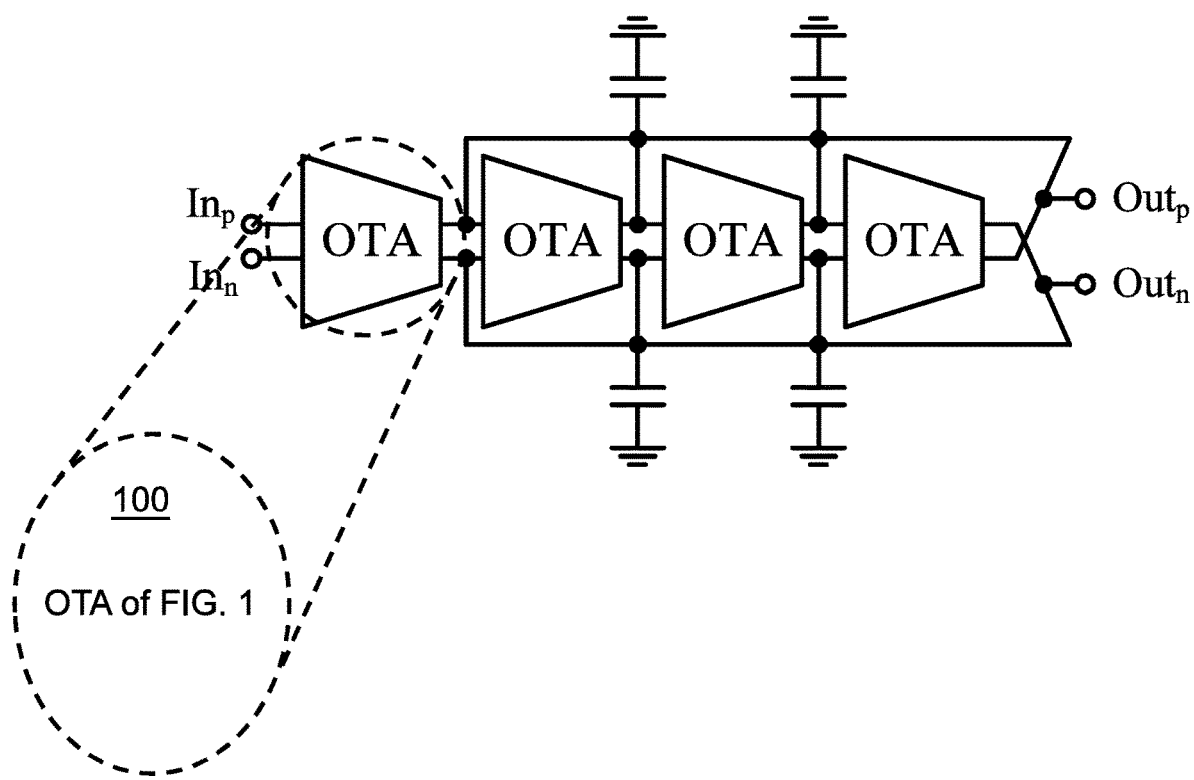
FIG. 5 illustrates another application of the operational transconductance amplifier of FIG. 3A according to one embodiment of the present invention.

In one embodiment, as shown in FIG. 5, the OTA of the present invention can be utilized to implement fully differential $G_m$-C filters for low-power operation.

The present invention has many advantages: (1) low power consumption: complementary differential pair provides double $G_m$ and telescopic cascode topology provides high gain without extra current; (2) saving cost: reducing circuit area and current consumption for the cascode biasing branch; (3) supplies flexibility: gates of the cascode transistors can be regulated at optimized points; (4) ensuring output swing range: the casocde transistors can be operated in subthreshold region to guarantee small $V_{DS}$ ($V_{GS}$ is always equal to $2V_{DSsat}$); (5) completely symmetrical: up-down symmetry improves output swing and bilateral symmetry benefits second-order harmonic rejection, CMRR and PSRR.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit for implementing an operational transconductance amplifier (OTA), said circuit comprising:
a first pair of transistors, comprising a first transistor having a first terminal, a second terminal and a third terminal and a second transistor having a fourth terminal, a fifth terminal and a sixth terminal, wherein the second terminal and the fourth terminal are connected at a first node, and the third terminal and the sixth terminal are connected at a second node;
a second pair of transistors, comprising a third transistor having a seventh terminal, an eighth terminal and a ninth terminal and a fourth transistor having a tenth terminal, an eleventh terminal and a twelfth terminal, wherein the eighth terminal and the eleventh terminal are connected at a third node, and the ninth terminal and the twelfth terminal are connected at a fourth node;
a third pair of transistors, comprising a fifth transistor having a thirteenth terminal, a fourteenth terminal and a fifteenth terminal and a sixth transistor having a sixteenth terminal, a seventeenth terminal and an eighteenth terminal, wherein the fourteenth terminal and the seventeenth terminal are connected to the second node, and the fifteenth terminal and the eighteenth terminal are connected at a fifth node;
a fourth pair of transistors, comprising a seventh transistor having a nineteenth terminal, a twentieth terminal and a twenty-first terminal and an eighth transistor having a twenty-second terminal, a twenty-third terminal and a twenty-fourth terminal, wherein the twentieth terminal and the twenty-third terminal are connected to the fourth node, and the twenty-first terminal and the twenty-fourth terminal are connected at a sixth node;
a fifth pair of transistors, comprising a ninth transistor having a twenty-fifth terminal, a twenty-sixth terminal and a twenty-seventh terminal and a tenth transistor having a twenty-eighth terminal, a twenty-ninth terminal and a thirtieth terminal, wherein the twenty-sixth terminal is connected to the fifth node that is connected to the fifth terminal of the second transistor and the seventh terminal of the third transistor, and the thirtieth terminal is connected to the first node that is connected to the thirteenth terminal of the fifth transistor and the twenty-second terminal of the eighth transistor, wherein the twenty-fifth terminal and the twenty-eighth terminal are connected at a seventh node; and
a sixth pair of transistors, comprising an eleventh transistor having a thirty-first terminal, a thirty-second terminal and a thirty-third terminal and a twelfth transistor having a thirty-fourth terminal, a thirty-fifth terminal and a thirty-sixth terminal, wherein the thirty-third terminal is connected to the sixth node that is connected to the first terminal and the tenth terminal, and the thirty-sixth terminal is connected to the third node that is connected to the sixteenth terminal and the nineteenth terminal, wherein, the thirty-first terminal and the thirty-fourth terminal are connected at an eighth node;

wherein the fourth node and the second node are capable of outputting a first pair of differential signals according to a second pair of differential signals inputted to the seventh node and the eighth node.

2. The circuit for implementing the operational transconductance amplifier (OTA) according to claim 1, wherein the twenty-ninth terminal and the thirty-fifth terminal are connected to a current source, and the twenty-seventh terminal and the thirty-second terminal are connected to another current source.

3. The circuit for implementing the operational transconductance amplifier (OTA) according to claim 1, wherein each of the twenty-ninth terminal, the thirty-fifth terminal, the twenty-seventh terminal and the thirty-second terminal is respectively connected to a separate current source.

4. The circuit for implementing the operational transconductance amplifier (OTA) according to claim 1, wherein each of the twenty-ninth terminal and the thirty-fifth terminal is respectively connected to a separate current source, and the twenty-seventh terminal and the thirty-second terminal are connected to another current source.

5. The circuit for implementing the operational transconductance amplifier (OTA) according to claim 1, wherein each of the first, second, third, fourth, tenth and twelfth transistors is a P-type CMOS transistor, and each of the fifth, sixth, seventh, eighth, ninth, eleventh transistors is an N-type CMOS transistor.

6. The circuit for implementing the operational transconductance amplifier (OTA) according to claim 1, wherein each of the first, second, third, fourth, tenth and twelfth transistors is an N-type CMOS transistor, and each of the fifth, sixth, seventh, eighth, ninth, eleventh transistors is a P-type CMOS transistor.

7. The circuit for implementing the operational transconductance amplifier (OTA) according to claim 1, wherein each transistor in the first pair of transistors, the second pair of transistors, the third pair of transistors and the fourth pair of transistors is operated in the subthreshold region.

8. The circuit for implementing the operational transconductance amplifier (OTA) according to claim 1, wherein each of the first, second, third, fourth, tenth and twelfth transistors is a PNP Bipolar transistor, and each of the fifth, sixth, seventh, eighth, ninth, eleventh transistors is an NPN Bipolar transistor.

9. The circuit for implementing the operational transconductance amplifier (OTA) according to claim 1, wherein each of the first, second, third, fourth, tenth and twelfth transistors is an NPN Bipolar transistor, and each of the fifth, sixth, seventh, eighth, ninth, eleventh transistors is a PNP Bipolar transistor.

10. The circuit for implementing the operational transconductance amplifier (OTA) according to claim 1, wherein the OTA is adopted in a low-power sensing amplifier with high gain.

11. The circuit for implementing the operational transconductance amplifier (OTA) according to claim 1, wherein the OTA is utilized to implement fully differential $G_m$-C filters for low-power operation.

* * * * *